United States Patent
Zhang et al.

(10) Patent No.: US 11,492,514 B2
(45) Date of Patent: Nov. 8, 2022

(54) DERIVATIZED POLYAMINO ACIDS

(71) Applicant: CMC Materials, Inc., Aurora, IL (US)

(72) Inventors: Na Zhang, Naperville, IL (US); David Bailey, Victor, NY (US); Kevin P. Dockery, Aurora, IL (US); Roman A. Ivanov, Aurora, IL (US); Deepak Shukla, Webster, NY (US)

(73) Assignee: CMC Materials, Inc., Aurora, IL (US)

( * ) Notice: Subject to any disclaimer, the term of this patent is extended or adjusted under 35 U.S.C. 154(b) by 0 days.

(21) Appl. No.: 17/123,295

(22) Filed: Dec. 16, 2020

(65) Prior Publication Data
US 2021/0206920 A1 Jul. 8, 2021

Related U.S. Application Data

(60) Provisional application No. 62/958,033, filed on Jan. 7, 2020.

(51) Int. Cl.
| | |
|---|---|
| *C09G 1/02* | (2006.01) |
| *C08G 69/48* | (2006.01) |
| *H01L 21/3105* | (2006.01) |
| *H01L 21/321* | (2006.01) |
| *C09G 1/04* | (2006.01) |
| *C09G 1/06* | (2006.01) |

(Continued)

(52) U.S. Cl.
CPC ............ *C09G 1/02* (2013.01); *B24B 1/00* (2013.01); *B24B 37/044* (2013.01); *C08G 69/48* (2013.01); *C09G 1/00* (2013.01); *C09G 1/04* (2013.01); *C09G 1/06* (2013.01); *C09K 3/1454* (2013.01); *C09K 3/1463* (2013.01); *C09K 13/06* (2013.01); *H01L 21/30625* (2013.01); *H01L 21/31053* (2013.01); *H01L 21/3212* (2013.01); *C08G 69/10* (2013.01)

(58) Field of Classification Search
None
See application file for complete search history.

(56) References Cited

U.S. PATENT DOCUMENTS

| | | | |
|---|---|---|---|
| 10,124,464 B2 | 11/2018 | Cavanaugh et al. | |
| 2019/0085209 A1* | 3/2019 | Dockery | ............... C09G 1/00 |

FOREIGN PATENT DOCUMENTS

| | | |
|---|---|---|
| WO | 2016065060 A1 | 4/2016 |
| WO | 2019055749 A1 | 3/2019 |
| WO | 2017162462 A1 | 9/2019 |

OTHER PUBLICATIONS

K. Cheemalapati et al., "Key Chemical Components in Metal CMP Slurries", in Microelectronic Applications of Chemical Mechanical Planarization, edited by Y. Li, John Wiley & Sons, p. 225). (Year: 2008).*

(Continued)

*Primary Examiner* — Jiong-Ping Lu
(74) *Attorney, Agent, or Firm* — Thomas Omholt

(57) ABSTRACT

A composition comprises, consists of, or consists essentially of a polymer including a derivatized amino acid monomer unit. A chemical mechanical polishing composition includes a water based liquid carrier, abrasive particles dispersed in the liquid carrier, and a cationic polymer having a derivatized amino acid monomer unit. A method of chemical mechanical polishing includes utilizing the chemical mechanical polishing composition to remove at least a portion of a metal or dielectric layer from a substrate and thereby polish the substrate.

29 Claims, 1 Drawing Sheet

(51) Int. Cl.
*B24B 1/00* (2006.01)
*B24B 37/04* (2012.01)
*C09K 3/14* (2006.01)
*C09G 1/00* (2006.01)
*H01L 21/306* (2006.01)
*C09K 13/06* (2006.01)
*C08G 69/10* (2006.01)

(56) References Cited

OTHER PUBLICATIONS

Korean Intellectual Property Office, International Search Report and Written Opinion of the International Searching Authority issued in connection with PCT/US2020/065212 dated Mar. 30, 2021.
Taiwan Intellectual Property Office, Search Report issued in connection with Taiwan Patent Application No. 109144383 dated Dec. 21, 2021.

* cited by examiner

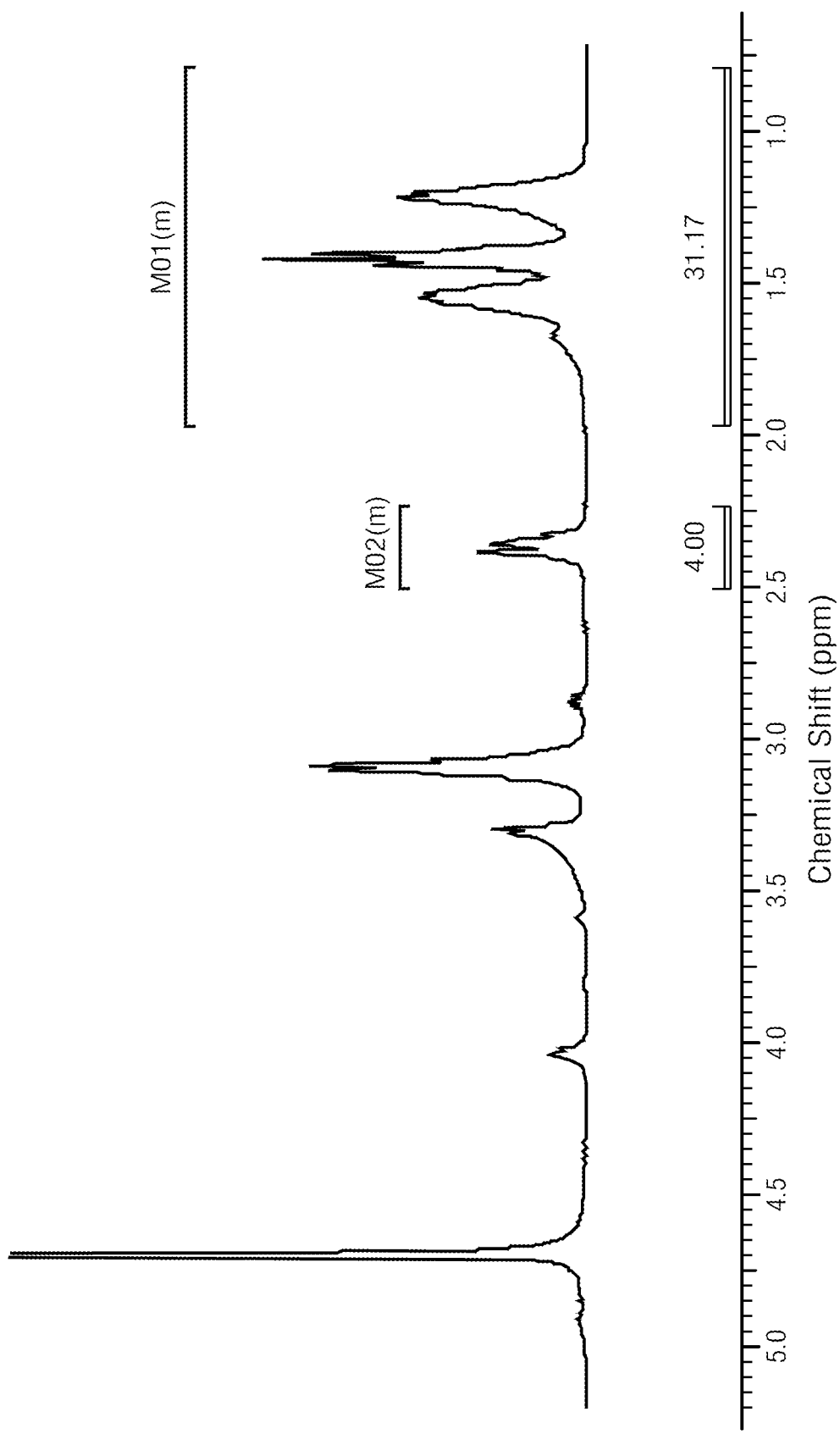

DERIVATIZED POLYAMINO ACIDS

CROSS-REFERENCE TO RELATED APPLICATIONS

None.

FIELD OF THE INVENTION

The disclosed embodiments are related to a derivatized polyamino acid. Particular embodiments are related to chemical mechanical polishing slurries including a derivatized polyamino acid such as derivatized ε-polylysine.

BACKGROUND OF THE INVENTION

A number of chemical-mechanical polishing (CMP) operations are used in both front-end-of-the-line (FEOL) and back-end-of-the-line (BEOL) processing of semiconductor devices. For example, shallow trench isolation (STI) is an FEOL process used prior to formation of the transistors to form a pattern of inlaid tetraethyl orthosilicate (TEOS) in the silicon wafer. Tungsten plug and interconnect and copper interconnect and dual damascene processes are BEOL processes used to form the network of metal wires that connect the device transistors. In these processes metal layers are deposited in openings formed in a dielectric material (e.g., TEOS). Chemical mechanical polishing (CMP) is used to remove the excess metal from the dielectric and thereby form conductive plugs and/or interconnects therein. An interlayer dielectric (ILD) material (such as TEOS) is deposited between metal interconnect levels to provide electrical insulation between the levels.

As semiconductor device feature sizes continue to shrink, meeting local and global planarity requirements has become increasingly difficult in CMP operations (particularly in metal CMP operations). Array erosion (also referred to as simply erosion or oxide erosion) and plug and line recessing (also referred to as dishing) are known to compromise planarity and overall device integrity. Moreover, local metal etching/corrosion loss may cause electrical contact problems that can degrade electrical performance. There is a need in the industry for metal CMP slurries (or compositions), for example, tungsten CMP compositions, that provide for improved planarity and reduced metal loss during metal CMP operations.

Furthermore, as known to those of ordinary skill in semiconductor fabrication, cobalt is sometimes selected over tungsten as a level one interconnect material owing to improved electrical performance. However, cobalt can be highly susceptible to corrosion. Inhibition of cobalt corrosion is therefore of significant relevance in a cobalt CMP polishing composition. Inhibition of cobalt corrosion can also be of significant relevance to tungsten CMP operations (to prevent cobalt corrosion should the tungsten polishing composition migrate to cobalt structures lower in the stack). There is an emerging need for CMP slurries that are able to efficiently planarize cobalt and that inhibit cobalt corrosion.

BRIEF SUMMARY OF THE INVENTION

A composition comprises, consists of, or consists essentially of a polymer including a derivatized amino acid monomer unit. The polymer may be dissolved in a liquid carrier. A chemical mechanical polishing composition for polishing a substrate includes a water based liquid carrier, abrasive particles dispersed in the liquid carrier, and a cationic polymer having a derivatized amino acid monomer. In one example embodiment, the abrasive particles may include colloidal silica and the cationic polymer may include derivatized polylysine. A method for chemical mechanical polishing a substrate is further disclosed. The method may include contacting the substrate with the above described polishing composition, moving the polishing composition relative to the substrate, and abrading the substrate to remove a portion of a metal or dielectric layer from the substrate and thereby polish the substrate.

BRIEF DESCRIPTION OF THE DRAWING

For a more complete understanding of the disclosed subject matter, and advantages thereof, reference is now made to the following description taken in conjunction with the accompanying FIG. 1 which depicts a proton NMR spectrum of Composition 1A in Example 1.

DETAILED DESCRIPTION OF THE INVENTION

Compositions comprising, consisting of, or consisting essentially of a derivatized polyamino acid are disclosed. For example, the composition may include a polymer having a derivatized amino acid monomer (i.e., a derivatized polyamino acid). In certain embodiments, the derivatized polyamino acid may be dissolved in a liquid carrier (e.g., an aqueous liquid carrier). The composition may advantageously inhibit metal corrosion, particularly corrosion of tungsten and cobalt metals and alloys.

A chemical mechanical polishing (CMP) composition for polishing a substrate is also disclosed. The polishing composition includes a water based liquid carrier, abrasive particles dispersed in the liquid carrier, and a cationic polymer having a derivatized amino acid monomer (also referred to herein as a derivatized polyamino acid or a derivatized polyamino acid compound). The CMP composition may include substantially any cationic polymer containing the derivatized amino acid monomer unit including homopolymers and copolymers. As is known to those of ordinary skill, copolymers include two or more different monomer units. In suitable copolymers at least one of the monomer units is a derivatized amino acid.

The disclosed compositions and methods may provide various technical advantages and improvements over the prior art. For example, disclosed compositions may inhibit metal corrosion and/or etching, particularly of tungsten and cobalt metal layers. The disclosed composition may further provide improved tungsten removal rate as well as improved topography (improved pattern wafer performance) in metal CMP operations.

It will be appreciated that the disclosed CMP compositions may be advantageously utilized for metal or dielectric CMP operations including tungsten CMP operations, cobalt CMP operations, and advanced dielectric CMP operations. The disclosed compositions may be particularly well suited for bulk removal and/or buff metal CMP operations (which are sometimes referred to in the art as first and second step CMP operations). As is known to those of skill in the art, bulk removal operations may require higher removal rates while buff operations may require lower defect levels. The disclosed CMP compositions may also be advantageously utilized for single step CMP operations. While the disclosed embodiments may be particularly well suited for tungsten and cobalt CMP operations, they are not intended to be limited to any particular metal CMP operation or dielectric CMP operation.

The polishing composition contains abrasive particles suspended in a liquid carrier. The liquid carrier is used to facilitate the application of the abrasive particles and any optional chemical additives to the surface of the substrate to be polished (e.g., planarized). The liquid carrier may be any suitable carrier (e.g., a solvent) including lower alcohols (e.g., methanol, ethanol, etc.), ethers (e.g., dioxane, tetrahydrofuran, etc.), water, and mixtures thereof. Preferably, the liquid carrier comprises, consists essentially of, or consists of water, more preferably deionized water.

The abrasive particles that are suspended in the liquid carrier may include substantially any suitable abrasive material such as metal oxide particles, diamond particles, and/or ceramic particles. Metal oxide particles may include, for example, silica, ceria, and/or alumina abrasive particles including colloidal and/or fumed metal oxide particles. Ceramic particles may include materials such as cubic boron nitride or silicon carbide. The disclosed embodiments are expressly not limited with regard to the abrasive particles.

In certain embodiments (such as in Examples 1-9 disclosed below), the abrasive may include colloidal silica. As used herein the term colloidal silica particles refers to silica particles that are prepared via a wet process rather than a pyrogenic or flame hydrolysis process which produces structurally different particles. The colloidal silica particles may be aggregated or non-aggregated. Non-aggregated particles are individually discrete particles that may be spherical or nearly spherical in shape, but can have other shapes as well (such as generally elliptical, square, or rectangular cross-sections). Aggregated particles are particles in which multiple discrete particles are clustered or bonded together to form aggregates having generally irregular shapes. Aggregated colloidal silica particles are disclosed, for example, in commonly assigned U.S. Pat. No. 9,309,442.

In certain other embodiments (such as in Example 10 disclosed below), the abrasive may include ceria particles. The use of ceria particles may be advantageous, for example, in certain dielectric and advanced dielectric CMP operations. Substantially any suitable ceria abrasive particle may be utilized, for example, including wet process ceria (such as HC60™ commercially available from Rhodia), sintered ceria (e.g., as disclosed in commonly assigned U.S. Pat. No. 9,505,952), and cubiform ceria (e.g., as disclosed in commonly assigned U.S. Provisional Patent Application Ser. No. 62/924,328). The disclosed embodiments are not limited in these regards.

The abrasive particles may have substantially any suitable particle size. The particle size of a particle suspended in a liquid carrier may be defined in the industry using various means. For example, the particle size may be defined as the diameter of the smallest sphere that encompasses the particle and may be measured using a number of commercially available instruments, for example, including the CPS Disc Centrifuge, Model DC24000HR (available from CPS Instruments, Prairieville, La.) or the Zetasizer® available from Malvern Instruments®. The abrasive particles may have an average particle size of about 5 nm or more (e.g., about 10 nm or more, about 20 nm or more, about 30 nm or more, about 40 nm or more, about 50 nm or more, or about 60 nm or more). The abrasive particles may have an average particle size of about 300 nm or less (e.g., about 250 nm or less, about 200 nm or less, about 180 nm or less, or about 150 nm or less). Accordingly, the abrasive particles may have an average particle size in a range bounded by any two of the above endpoints. For example, the abrasive particles may have an average particle size in a range from about 5 nm to about 300 nm (e.g., from about 20 nm to about 200 nm, from about 40 nm to about 200 nm, or from about 50 nm to about 150 nm).

The polishing composition may include substantially any suitable amount of the abrasive particles. The polishing composition may include about 0.01 wt. % or more of the abrasive particles at point of use (e.g., about 0.02 wt. % or more, about 0.05 wt. % or more, about 0.1 wt. % or more, about 0.2 wt. % or more, or 0.5 wt. % or more). The polishing composition may also include about 20 wt. % or less of the abrasive particles at point of use (e.g., about 10 wt. % or less, about 5 wt. % or less, about 3 wt. % or less, or about 1 wt. % or less). Accordingly, the point of use concentration of abrasive particles in the polishing composition may be in a range bounded by any two of the above endpoints. For example, the amount of abrasive particles in the polishing composition may be in a range from about 0.01 wt. % to about 20 wt. % (e.g., from about 0.02 wt. % to about 10 wt. %, from about 0.05 wt. % to about 5 wt. %, from about 0.1 wt. % to about 3 wt. %, from about 0.1 wt. % to about 1 wt. %).

In embodiments in which the abrasive particles include silica (such as colloidal or pyrogenic silica) the silica particles preferably have a positive charge in the polishing composition. The charge on dispersed particles such as silica particles is commonly referred to in the art as the zeta potential (or the electrokinetic potential). The zeta potential of a particle refers to the electrical potential difference between the electrical charge of the ions surrounding the particle and the electrical charge of the bulk solution of the polishing composition (e.g., the liquid carrier and any other components dissolved therein). The zeta potential is typically dependent on the pH of the aqueous medium. For a given polishing composition, the isoelectric point of the particles is defined as the pH at which the zeta potential is zero. As the pH is increased or decreased away from the isoelectric point, the surface charge (and hence the zeta potential) is correspondingly decreased or increased (to negative or positive zeta potential values). The zeta potential of a dispersion such as a polishing composition may be obtained using commercially available instrumentation such as the Zetasizer available from Malvern Instruments, the ZetaPlus Zeta Potential Analyzer available from Brookhaven Instruments, and/or an electro-acoustic spectrometer available from Dispersion Technologies, Inc.

In certain embodiments, the abrasive particles comprise colloidal silica particles having a positive charge of about 6 mV or more (e.g., about 10 mV or more, about 15 mV or more, or about 20 mV or more). The colloidal silica particles in the polishing composition may have a positive charge of about 50 mV or less (e.g., about 45 mV or less or about 40 mV or less). Accordingly, the colloidal silica particles may have a positive charge in a range bounded by any two of the above endpoints. For example, the colloidal silica particles may have a positive charge from about 6 mV to about 50 mV (e.g., about 10 mV to about 45 mV, about 15 mV to about 45 mV, or about 20 mV to about 40 mV).

While the disclosed embodiments are not limited in this regard, the colloidal silica particles may advantageously have a permanent positive charge. By permanent positive charge it is meant that the positive charge on the silica particles is not readily reversible, for example, via flushing, dilution, filtration, and the like. A permanent positive charge may be the result, for example, of covalently bonding a cationic compound with the colloidal silica. A permanent positive charge is in contrast to a reversible positive charge that may be the result, for example, of an electrostatic interaction between a cationic compound and the colloidal silica. Notwithstanding, as used herein, a permanent positive charge of at least 6 mV means that the zeta potential of the colloidal silica particles remains above 6 mV after the three step ultrafiltration test described in further detail in commonly assigned U.S. Pat. No. 9,238,754, which is incorporated by reference herein in its entirety.

Colloidal silica particles having a permanent positive charge in the polishing composition may be obtained, for example, via treating the particles with at least one aminosilane compound as disclosed in commonly assigned U.S. Pat. Nos. 7,994,057 and 9,028,572. Alternatively, colloidal silica particles having a permanent positive charge in the polishing composition may be obtained by incorporating a chemical species, such as an aminosilane compound, in the colloidal silica particles as disclosed in in commonly assigned U.S. Pat. No. 9,422,456.

The polishing composition further includes a cationic polymer having a derivatized amino acid monomer. The CMP composition may include substantially any cationic polymer containing the derivatized amino acid monomer unit including homopolymers and copolymers. As is known to those of ordinary skill, copolymers include two or more different monomer units. In suitable copolymers at least one of the monomer units is a derivatized amino acid. As described in more detail below, many of the disclosed cationic polymers may be thought of as copolymers in that they include non-derivatized amino acid monomer units and derivatized amino acid monomer units.

The cationic polymer may be derivatized from a non-derivatized polyamino acid. It will be appreciated that polyamino acid compounds are polymers derived from amino acid monomers. One example polyamino acid suitable for derivatization is depicted below in Formula 1.

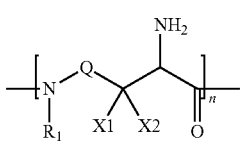

Polyamino Acid Homopolymer

Formula 1

In the example cationic polymer depicted in Formula 11, Q is an optional linking group and may include substantially any linking group, for example, including a branched or straight chain alkyl group. $X_1$ and $X_2$ may be substantially any group, for example, including hydrogen or an alkyl group. $R_1$ may also be substantially any suitable substituent group including, for example, OH, H, or an alkyl group.

As noted above the cationic polymer in Formula 1 may be derivatized to obtain a cationic polymer having a derivatized amino acid monomer. One example derivatized polyamino acid is depicted in Formula 2.

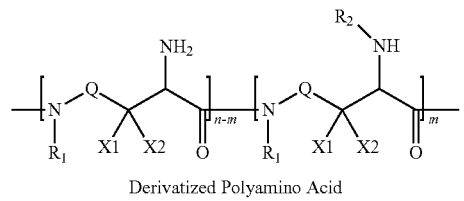

Derivatized Polyamino Acid

Formula 2

In the example derivatized polymer depicted in Formula 2 Q, $X_1$, $X_2$, and $R_1$ are as defined above with respect to Formula 1. The lower-case letters m and n are used to denote the repeating units of the polymer in which n represents the number of repeating units in the original non-derivatized polyamino acid, and m represents the number derivatized amino acid monomer units such that such that n-m represents the number of remaining non-derivatized monomer units. The degree of (or percent) derivatization may be defined as m/n. In certain advantageous embodiments, for example to promote solubility, n may be less than 200 and m/n may be less than about ⅔.

With continued reference to Formula 2, it will be appreciated that the derivatized monomer unit includes a derivative group $R_2$ bonded to the alpha amino group of the derivatized amino acid monomer. In the disclosed embodiments, $R_2$ may include substantially any suitable derivative group. For example, suitable groups include an alkyl carbonyl group, a divalent carboacyl group, an alkyl urea group, an alkyl sulfonate group, an alkyl sulfone group, and an alkyl ester group.

Example alkyl carbonyl groups include an acetyl group, a pivaloyl group, an ethyl carbonyl group, and the like. Example divalent carboacyl groups include a succinyl group, an octenyl succinyl group, a glutaric group, a methyl succinyl group, and the like. Among divalent carboacyl groups, a succinyl group and a glutaric group may be preferred owing to solubility. Example alkyl urea groups include ethyl urea, butyl urea, cyclohexyl urea, and the like. Example alkyl sulfonate groups include methyl sulfonate, dimethyl sulfonate, ethyl sulfonate, propyl sulfonate, butyl sulfonate, penta sulfonate, and the like. Example alkyl sulfone groups include methyl sulfone, ethyl sulfone, propyl sulfone, butyl sulfone, penta sulfone, and the like. Example alkyl ester groups include methyl ester, ethyl ester, propyl ester, butyl ester, penta ester, and the like.

Example derivatized amino acid monomers are show in Formulas 3A, 3B, 3C, and 3D (collectively Formula 3) in which $R_2$ is an acetyl group (2A), a succinyl group (2B), an ethyl urea group (2C), and a propyl sulfonate group (2D).

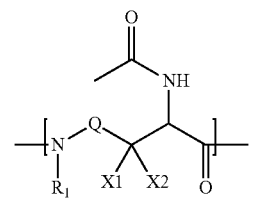

Formula 3A: Acetyl

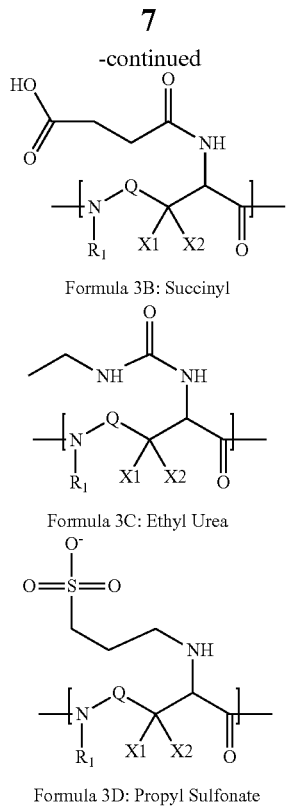

Formula 3B: Succinyl

Formula 3C: Ethyl Urea

Formula 3D: Propyl Sulfonate

With continued reference to Formulas 1, 2, and 3, the derivatized cationic polymers may be obtained, for example, by combining a cationic polyamino acid (e.g., as depicted on Formula 1) with a suitable amount of a derivatization compound. The derivatization compound may then react with the alpha amino group of the cationic polyamino acid (e.g., via a condensation reaction) to form the derivatized cationic polymer having one of the derivative groups described above with respect to Formulas 2 and 3).

In certain example embodiments a derivatized cationic polymer having a divalent carboacyl group may be obtained, for example, by adding a suitable amount of an anhydride compound including the divalent carboacyl group to an aqueous solution of the cationic polyamino acid. The pH of the solution may be adjusted to a value above 7 to promote derivatization of the polyamino acid via a condensation reaction. The degree of derivatization may be controlled by the relative amounts of the polyamino acid and the anhydride compound.

In other example embodiments a derivatized cationic polymer having an alkyl carbonyl group, an alkyl urea group, or an alkyl sulfonate group may be obtained by adding a suitable amount of an alkyl carbonyl compound, and alkyl isocyanate compound, or a sultone compound to a solution of the cationic polyamino acid in methanol. The solution may be heated to promote derivatization of the polyamino acid via a condensation reaction. The methanol may then be removed via evaporation to obtain a derivatized polyamino acid compound which may then be dissolved in water. The degree of derivatization may be controlled by the relative amounts of the polyamino acid and the derivatizing compound and/or by the reaction time.

While the foregoing disclosure describes processes by which the derivatized cationic polymers may be obtained by combining a polyamino acid (a polymer) with a derivatization compound, it will be understood that the disclosed embodiments are not so limited. For example, in alternative embodiments amino acid monomers may first be derivatized (e.g., via reaction with one or more of the aforementioned groups) and may then subsequently be polymerized. The disclosed embodiments are expressly not limited in regard to any methodology by which the derivatized cationic polymers are obtained.

The disclosed polishing composition may include substantially any suitable derivatized polyamino acid. For example, the derivatized polyamino acid may include derivatized polyarginine, derivatized polyornithine, derivatized polyhistidine, and derivatized polylysine. In preferred embodiments, the derivatized polyamino acid compounds include derivatized polylysine, derivatized polyarginine, and derivatized polyhistidine. Most preferred derivatized polyamino acid compounds include derivatized polylysine.

It will be understood that polylysine may include ε-polylysine and/or α-polylysine composed of D-lysine and/or L-lysine and therefore may include α-poly-L-lysine, α-poly-D-lysine, ε-poly-L-lysine, ε-poly-D-lysine, and mixtures thereof. In certain preferred embodiments, the derivatized polylysine may include a derivatized ε-poly-L-lysine (ε-poly-L-lysine is commonly referred to in the chemical arts as εPLL or EPL). It will be appreciated that Formulas 1 depicts ε-poly-L-lysine and that Formula 2 depicts derivatized ε-poly-L-lysine when Q is $C_2H_4$ and $X_1$, $X_2$, and $R_1$ are H.

The derivatized cationic polymer may include a titratable group with an acid dissociation constant ($pK_a$) greater than about 5 (e.g., greater than about 6). For example, the titratable group may have a dissociation constant in a range from about 5 to about 14 or preferably in a range from about 6 to about 11.

It will further be understood that the derivatized polyamino acid compound (or compounds) may be used in any accessible form, e.g., the conjugate acid or base and salt forms of the derivatized polyamino acid may be used instead of (or in addition to) the acid. The term "acid" as it is used in this context to describe useful derivatized polyamino acid compounds is intended to mean the derivatized polyamino acid and any form that can be accessed by adjusting the pH to modify any titratable functional groups that may be present. Such forms include its conjugate base or acid and any other salt there-of. For example, the term "polylysine" means the polylysine amino acid as well as its conjugate acid formed by protonating the amine functional group.

Suitable derivatized polyamino acid compounds may have substantially any molecular weight and polydispersity index. For example, the derivatized polyamino acid compound may have a molecular weight in a range from about 1 to about 100 kDa. It will be understood, however, that the disclosed embodiments are not limited by the molecular weight or the polydispersity index of the derivatized polyamino acid compounds.

In certain CMP compositions (e.g., metal CMP compositions), the use of one or more derivatized polyamino acid compounds is intended to inhibit metal corrosion, for example, corrosion of tungsten and/or cobalt plugs and lines in the IC device. Such corrosion inhibition may advantageously further result in reduced plug and line recessing (i.e., dishing) as well as reduce array erosion.

The amount of derivatized polyamino acid compound in the polishing composition may be varied depending, for example, upon the particular derivatized polyamino acid compound used, the degree of derivatization, and other optional components in the composition. It will be understood that there may be a tradeoff in selecting the amount of derivatized polyamino acid compound. For example, increasing the amount of the derivatized polyamino acid may further reduce the corrosion rate but at the expense of a reduced overall CMP removal rate. Thus, the amount of derivatized polyamino acid may also be varied depending upon the overall process goals of the CMP operation.

When a derivatized polylysine is used (e.g., derivatized ε-poly-L-lysine) in a tungsten CMP composition in combination with a hydrogen peroxide oxidizer and a soluble iron containing catalyst, the derivatized polylysine may be present in the composition at point of use in an amount ranging from about 1 to about 1000 ppm based on the total weight of the composition. The polishing composition may include about 1 ppm or more of the derivatized polylysine at point of use (e.g., about 5 ppm or more, about 10 ppm or more, about 15 ppm or more or about 20 ppm or more). The polishing composition may also include about 1000 ppm or less of the derivatized polylysine at point of use (e.g., about 500 ppm or less, about 400 ppm or less, about 200 ppm or less, or about 100 ppm or less). Accordingly, the derivatized polylysine may be present in the composition at point of use in an amount bounded by any of the above endpoints. For example, the derivatized polylysine may be present in the composition at point of use in a concentration range from about 1 to about 1000 ppm (e.g., from about 5 to about 500 ppm, from about 10 to about 400 ppm, or from about 20 to about 200 ppm).

When a derivatized polylysine is used (e.g., derivatized ε-poly-L-lysine) in a cobalt CMP composition, the polishing composition may include about 1 ppm or more derivatized polylysine at point of use (e.g., about 10 ppm or more, about 20 ppm or more, about 30 ppm or more, or about 50 ppm or more). The polishing composition may also include about 1000 ppm or less derivatized polylysine at point of use (e.g., about 800 ppm or less, about 500 ppm or less, about 400 ppm or less, or about 300 ppm or less). Accordingly, the derivatized polylysine may be present in the polishing composition at point of use in an amount bounded by any of the above endpoints. For example, the derivatized polylysine may be present in the composition in a concentration range from about 1 to about 1000 ppm (e.g., from about 10 to about 800 ppm, from about 20 to about 500 ppm, or from about 40 to about 400 ppm).

When a derivatized polylysine is used (e.g., derivatized ε-poly-L-lysine) in an advanced dielectric CMP composition including a ceria abrasive, the polishing composition may include about 1 ppm or more derivatized polylysine at point of use (e.g., about 2 ppm or more, about 5 ppm or more, or about 10 ppm or more). The polishing composition may also include about 200 ppm or less derivatized polylysine at point of use (e.g., about 150 ppm or less, about 100 ppm or less, or about 50 ppm or less). Accordingly, the derivatized polylysine may be present in the polishing composition at point of use in an amount bounded by any of the above endpoints. For example, the derivatized polylysine may be present in the composition in a concentration range from about 1 to about 200 ppm (e.g., from about 2 to about 100 ppm, from about 5 to about 100 ppm, or from about 10 to about 50 ppm).

The polishing composition may have substantially any suitable pH depending on the end application. For example, a tungsten CMP composition may be generally acidic having a pH of less than about 7. A tungsten polishing composition may have a pH of 1 or more (e.g., about 1.5 or more, about 2 or more, about 2.5 or more, or about 3 or more) depend. A tungsten polishing composition may have a pH of about 6 or less (e.g., about 5 or less, about 4.5 or less, about 4 or less, or about 3.5 or less). Accordingly, the polishing composition may have a pH in a range bounded by any of the above values. For example, a tungsten polishing composition may have a pH in a range from about 1 to about 6 (e.g., from about 2 to about 5, from about 2 to about 4.5, or from about 2.5 to about 4.5). Polishing compositions used for bulk tungsten removal may preferably have a pH in a range from about 2 to about 4 (e.g., from about 2 to about 3.5). Polishing compositions used for a tungsten buffing operation may preferably have a pH in a range from about 3 to about 5 (e.g., from about 3 to about 4.5).

A cobalt polishing composition may generally be approximately neutral or slightly alkaline having a pH in a range from about 6 to about 10. For example, a cobalt polishing composition may have a pH of about 6 or more (e.g., about 6.5 or more, about 7 or more, about 7.5 or more, or about 8 or more). The polishing composition may further have a pH about 10 or less (e.g., about 9 or less, about 8.5 or less, or about 8 or less). The polishing composition may thus have a pH in a range bounded by any two the above endpoints. For example, the pH may be in a range from about 6 to about 10 (e.g., from about 7 to about 9).

It will be understood that the pH of the polishing composition may be achieved and/or maintained by any suitable means (depending of course on the desired pH). The polishing composition may include substantially any suitable pH adjusting agents or buffering systems. For example, suitable pH adjusting agents may include nitric acid, sulfuric acid, phosphoric acid, phthalic acid, citric acid, adipic acid, oxalic acid, malonic acid, maleic acid, ammonium hydroxide, potassium hydroxide, tetraethyl ammonium hydroxide, tetrabutyl ammonium hydroxide, and the like while suitable buffering agents may include phosphates, sulfates, acetates, malonates, oxalates, borates, ammonium salts, propionates, mixtures thereof, and the like.

The polishing composition may include other optional compounds depending on the specific application. For example, a tungsten CMP composition may optionally further include an iron containing accelerator, a stabilizer, and/or an oxidizer. An iron containing accelerator as used herein is an iron containing chemical compound that increases the removal rate of tungsten during a tungsten CMP operation. For example, the iron containing accelerator may include a soluble iron containing catalyst such as is disclosed in U.S. Pat. Nos. 5,958,288 and 5,980,775. Such an iron containing catalyst may be soluble in the liquid carrier and may include, for example, ferric (iron III) or ferrous (iron II) compounds such as iron nitrate, iron sulfate, iron halides, including fluorides, chlorides, bromides, and iodides, as well as perchlorates, perbromates and periodates, and organic iron compounds such as iron acetates, carboxylic acids, acetylacetonates, citrates, gluconates, malonates, oxalates, phthalates, and succinates, and mixtures thereof.

An iron containing accelerator may also include an iron containing activator (e.g., a free radical producing compound) or an iron containing catalyst associated with (e.g., coated or bonded to) the surface of the colloidal silica particle such as is disclosed in U.S. Pat. Nos. 7,029,508 and 7,077,880. For example, the iron containing accelerator may be bonded with the silanol groups on the surface of the colloidal surface particle.

The amount of iron containing accelerator in the polishing composition may be varied depending upon the oxidizing agent used and the chemical form of the accelerator. When the oxidizing agent is hydrogen peroxide (or one of its analogs) and a soluble iron containing catalyst is used (such as ferric nitrate or hydrates of ferric nitrate), the catalyst may be present in the composition at point of use in an amount sufficient to provide a range from about 0.5 to about 3000 ppm Fe based on the total weight of the composition. The polishing composition may include about 1 ppm Fe or more at point of use (e.g., about 2 ppm or more, about 5 ppm or more, or about 10 ppm or more). The polishing composition may include about 500 ppm Fe or less at point of use (e.g., about 200 ppm or less, about 100 ppm or less, or about 50 ppm or less). The polishing composition may thus include Fe in a range bounded by any one of the above endpoints. The composition may include from about 1 to about 500 ppm Fe at point of use (e.g., from about 2 to about 200 ppm, from about 5 to about 100 ppm, or from about 10 to about 50 ppm). Polishing compositions used for bulk tungsten removal may preferably include from about 5 to about 50 ppm Fe (e.g., from about 10 to about 40 ppm Fe). Polishing compositions used for a tungsten buffing operation may preferably include from about 0.5 to about 20 ppm Fe (e.g., from about 1 to about 10 ppm Fe).

Embodiments of the polishing composition including an iron containing accelerator may further include a stabilizer. Without such a stabilizer, the iron containing accelerator and the oxidizing agent, if present, may react in a manner that degrades the oxidizing agent rapidly over time. The addition of a stabilizer tends to reduce the effectiveness of the iron containing accelerator such that the choice of the type and amount of stabilizer added to the polishing composition may have a significant impact on CMP performance. The addition of a stabilizer may lead to the formation of a stabilizer/accelerator complex that inhibits the accelerator from reacting with the oxidizing agent, if present, while at the same time allowing the accelerator to remain sufficiently active so as to promote rapid tungsten polishing rates.

Useful stabilizers include phosphoric acid, organic acids, phosphonate compounds, nitriles, and other ligands which bind to the metal and reduce its reactivity toward hydrogen peroxide decomposition and mixture thereof. The acid stabilizers may be used in their conjugate form, e.g., the carboxylate can be used instead of the carboxylic acid. The term "acid" as it is used herein to describe useful stabilizers also means the conjugate base of the acid stabilizer. Stabilizers can be used alone or in combination and significantly reduce the rate at which oxidizing agents such as hydrogen peroxide decompose.

Preferred stabilizers include phosphoric acid, acetic acid, phthalic acid, citric acid, adipic acid, oxalic acid, malonic acid, aspartic acid, succinic acid, glutaric acid, pimelic acid, suberic acid, azelaic acid, sebacic acid, maleic acid, glutaconic acid, muconic acid, ethylenediaminetetraacetic acid (EDTA), propylenediaminetetraacetic acid (PDTA), and mixtures thereof. The preferred stabilizers may be added to the compositions of this invention in an amount ranging from about 1 equivalent per iron containing accelerator to about 3.0 weight percent or more (e.g., from about 3 to about 10 equivalents). As used herein, the term "equivalent per iron containing accelerator" means one molecule of stabilizer per iron ion in the composition. For example 2 equivalents per iron containing accelerator means two molecules of stabilizer for each catalyst ion.

The polishing composition may optionally further include an oxidizing agent. The oxidizing agent may be added to the polishing composition during the slurry manufacturing process or just prior to the CMP operation (e.g., in a tank located at the semiconductor fabrication facility). Preferable oxidizing agents include inorganic or organic per-compounds. A per-compound as defined herein is a compound containing at least one peroxy group (—O—O—) or a compound containing an element in its highest oxidation state. Examples of compounds containing at least one peroxy group include but are not limited to hydrogen peroxide and its adducts such as urea hydrogen peroxide and percarbonates, organic peroxides such as benzoyl peroxide, peracetic acid, and di-t-butyl peroxide, monopersulfates ($SO_5^=$), dipersulfates ($S_2O_8^=$), and sodium peroxide. Examples of compounds containing an element in its highest oxidation state include but are not limited to periodic acid, periodate salts, perbromic acid, perbromate salts, perchloric acid, perchlorate salts, perboric acid, and perborate salts and permanganates. The most preferred oxidizing agent is hydrogen peroxide.

The oxidizing agent may be present in the polishing composition in an amount ranging, for example, from about 0.1 to about 10 weight percent at point of use. In embodiments in which a hydrogen peroxide oxidizer and a soluble iron containing accelerator are used, the oxidizer may be present in the polishing composition in an amount ranging from about 0.1 to about 6 weight percent at point of use (e.g., from about 0.2 to about 5 weight percent, from about 0.3 to about 4 weight percent, or from about 0.5 to about 3 weight percent).

A cobalt CMP composition may optionally (although not necessarily) further include a cobalt polishing accelerator. The optional cobalt polishing accelerator may be selected from nitrogen containing organic oxidizers such as a nitro compound, a nitroso compound, an N-oxide compound, an oxime compound, and combinations thereof. For example, a nitrogen containing organic oxidizer may include an aryl nitro compound, an aryl nitroso compound, an aryl N-oxide compound, an aryl oxime compound, a heteroaryl nitro compound, a heteroaryl nitroso compound, a heteroaryl N-oxide compound, a heteroaryl oxime compound, and combinations thereof.

The optional cobalt polishing accelerator may further be selected from non-oxidizing compounds such as an N-di(carboxylalkyl)amine, an N-di(hydroxyalkyl)amine, an N,N-di(hydroxyalkyl)-N-carboxylalkylamine, a dicarboxyheterocycle, a heterocyclylalkyl-α-amino acid, an N-aminoalkylamino acid, an unsubstituted heterocycle, an alkyl-substituted heterocycle, a carboxylic acid, a dicarboxylic acid, a tricarboxylic acid, an alkylamine, an N-aminoalkyl-α-amino acid, and combinations thereof. For example, the polishing composition may optionally include a cobalt accelerator selected from iminodiacetic acid ("IDA"), N-(2-acetamido)iminodiacetic acid ("ADA"), N-methylimidazole, picolinic acid, dipicolinic acid, 4-(2-hydroxyethyl)-1-piperazineethanesulfonic acid, glycine, bicine, triethylamine ("TEA"), etidronic acid, N-methylmorpholine, malonic acid, 2-pyridinesulfonate, citric acid and combinations thereof.

In optional embodiments including a cobalt polishing accelerator the accelerator may be present in the polishing composition at a concentration of about 1 mM or more at point of use (e.g., about 5 mM or more, about 10 mM or more, about 20 mM or more, or about 40 mM or more). The cobalt polishing accelerator may also be present in the polishing composition at a concentration of about 200 mM or less at point of use (e.g., about 150 mM or less, about 100 mM or less, about 80 mM or less, or about 60 mM or less). It will be understood that the cobalt polishing accelerator may be present in the polishing composition at a concentration bounded by any two of the above endpoints. For example, cobalt polishing accelerator may be present in the polishing composition at a concentration in a range from about 1 mM to about 200 mM at point of use (e.g., from about 5 mM to about 150 mM, from about 10 mM to about 100 mM, or from about 20 mM to about 60 mM).

The polishing composition may optionally further include a biocide. The biocide may include any suitable biocide, for example an isothiazolinone biocide. The amount of biocide in the polishing composition may be in a range, for example, from about 1 ppm to about 500 ppm (e.g., from about 1 ppm to about 200 ppm).

The polishing composition may be prepared using any suitable techniques, many of which are known to those skilled in the art. The polishing composition may be prepared in a batch or continuous process. Generally, the polishing composition may be prepared by combining the components thereof in any order. The term "component" as used herein includes the individual ingredients (e.g., the abrasive particles, the derivatized polyamino acid, etc.)

For example, the abrasive particles (e.g., silica) may be dispersed in the aqueous liquid carrier. Other components such as the derivatized polyamino acid, and a biocide may then be added and mixed by any method that is capable of incorporating the components into the polishing composition. For optional compositions including an oxidizing agent, it will be understood that the oxidizer may be added at any time during the preparation of the polishing composition. For example, the oxidizing agent may be added just prior to the CMP operation (e.g., within about 1 minute, or within about 10 minutes, or within about 1 hour, or within about 1 day, or within about 1 week of the CMP operation). The polishing composition may also be prepared by mixing the components at the surface of the substrate (e.g., on the polishing pad) during the CMP operation.

The polishing composition of the invention may also be provided as a concentrate which is intended to be diluted with an appropriate amount of water prior to use. In such an embodiment, the polishing composition concentrate may include abrasive particles, the derivatized polyamino acid, and other optional components in amounts such that, upon dilution of the concentrate with an appropriate amount of water (and an optional oxidizing agent if not already present in an appropriate amount), each component of the polishing composition will be present in the polishing composition at point of use in an amount within the appropriate range recited above for each component. For example, the abrasive particles and the derivatized the polyamino acid may each be present in the polishing composition in an amount that is about 2 times (e.g., about 3 times, about 4 times, or about 5 times) greater than the point of use concentration recited above for each component so that, when the concentrate is diluted with an equal volume of water (e.g., 1 equal volume of water, 2 equal volumes of water, 3 equal volumes of water, or even 4 equal volumes of water respectively), along with the optional oxidizing agent in a suitable amount, each component will be present in the polishing composition in an amount within the ranges set forth above for each component. Furthermore, as will be understood by those of ordinary skill in the art, the concentrate may contain an appropriate fraction of the water present in the final polishing composition in order to ensure that other components are at least partially or fully dissolved in the concentrate.

The polishing composition of the invention may be used to polish substantially any substrate including a metal layer and/or a dielectric layer. In certain embodiments, the polishing composition may be particularly useful for polishing a substrate comprising at least one metal and at least one dielectric material. For example, certain embodiments may be useful for polishing a substrate comprising tungsten. Other embodiments may be useful for polishing a substrate comprising cobalt. As is known to those of ordinary skill, metal conductors are commonly deposited over one or more barrier layers, for example, including titanium and/or titanium nitride (TiN). The dielectric layer may be a metal oxide such as a silicon oxide layer derived from tetraethylorthosilicate (TEOS), porous metal oxide, porous or non-porous carbon doped silicon oxide, fluorine-doped silicon oxide, glass, organic polymer, fluorinated organic polymer, or any other suitable high or low-k insulating layer.

The polishing method of the invention is particularly suited for use in conjunction with a chemical mechanical polishing (CMP) apparatus. Typically, the apparatus includes a platen, which, when in use, is in motion and has a velocity that results from orbital, linear, or circular motion, a polishing pad in contact with the platen and moving with the platen when in motion, and a carrier that holds a substrate to be polished by contacting and moving relative to the surface of the polishing pad. The polishing of the substrate takes place by the substrate being placed in contact with the polishing pad and the polishing composition of the invention and then the polishing pad moving relative to the substrate, so as to abrade at least a portion of the substrate (such as tungsten, cobalt, titanium, titanium nitride, and/or a dielectric material as described herein) to polish the substrate.

A substrate can be planarized or polished with the chemical mechanical polishing composition with any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, co-formed products thereof, and mixtures thereof.

While CMP polishing compositions and methods are described in detail above, it will be understood that the disclosed embodiments are not strictly limited to chemical mechanical polishing. Disclosed embodiments may include an aqueous solution of a derivatized polyamino acid such as a derivatized polylysine. For example, a disclosed composition may include one or more derivatized polyamino acids dissolved in a liquid carrier comprising or consisting of water. A disclosed composition may also include a polymer including a derivatized amino acid monomer. The polymer may be in solid form (e.g., in granules) or dissolved in a liquid carrier. The derivatized amino acid monomer may include any of the derivative groups described above with respect to Formulas 1-3. For example, the derivative group may include an alkyl carbonyl group, a divalent carboacyl group, an alkyl urea group, an alkyl sulfonate group, an alkyl sulfone group, or an alky ester group.

It will be understood that the disclosure includes numerous embodiments. These embodiments include, but are not limited to, the following embodiments.

In a first embodiment a composition may comprise, consist of, or consist essentially of a polymer having a derivatized amino acid monomer unit.

A second embodiment may include the first embodiment wherein the polymer comprises a compound according to the following formula:

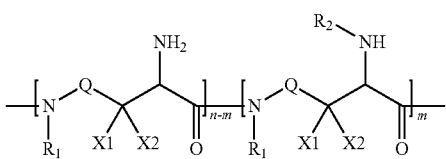

wherein Q is an optional linking group, $X_1$ and $X_2$ are substantially any group, $R_1$ is H, OH, or an alkyl group, and $R_2$ is a derivative group.

A third embodiment may include the second embodiment, wherein $R_2$ comprises at least one of an alkyl urea group and an alkyl sulfonate group.

A fourth embodiment may include the third embodiment, wherein the alkyl urea group comprises an ethyl urea group, a butyl urea group, and a cyclohexyl urea group and the alkyl sulfonate group comprises a methyl sulfonate group, a dimethyl sulfonate group, an ethyl sulfonate group, a propyl sulfonate group, a butyl sulfonate group, and a penta sulfonate group.

A fifth embodiment may include the second embodiment wherein $R_2$ comprises an ethyl urea group, a butyl urea group, a cyclohexyl urea group, or a propyl sulfonate group.

In a sixth embodiment, a composition comprises, consists of, or consists essentially of water and a cationic polymer having a derivatized amino acid monomer unit.

A seventh embodiment may include the sixth embodiment wherein the cationic polymer comprises a compound according to the following formula:

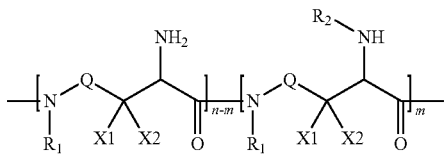

wherein Q is an optional linking group, $X_1$ and $X_2$ are substantially any group, $R_1$ is H, OH, or an alkyl group, and $R_2$ is a derivative group.

An eighth embodiment may include the seventh embodiment, wherein $R_2$ comprises at least one of an alkyl urea group and an alkyl sulfonate group.

A ninth embodiment may include the eighth embodiment, wherein the alkyl urea group comprises an ethyl urea group, a butyl urea group, and a cyclohexyl urea group and the alkyl sulfonate group comprises a methyl sulfonate group, a dimethyl sulfonate group, an ethyl sulfonate group, a propyl sulfonate group, a butyl sulfonate group, or a penta sulfonate group.

A tenth embodiment may include the seventh embodiment wherein $R_2$ comprises an ethyl urea group, a butyl urea group, a cyclohexyl urea group, or a propyl sulfonate group.

In an eleventh embodiment a chemical mechanical polishing composition comprises: a water based liquid carrier; abrasive particles dispersed in the liquid carrier, and a cationic polymer having a derivatized amino acid monomer unit.

A twelfth embodiment may include the eleventh embodiment wherein the abrasive particles comprise a colloidal silica abrasive having a permanent positive charge of at least 10 mV.

A thirteenth embodiment may include any one of the first, sixth, and eleventh through twelfth embodiments wherein the derivatized amino acid monomer unit comprises a derivative group bonded to an alpha amino group in the monomer unit.

A fourteenth embodiment may include any one of the first, sixth, and eleventh through thirteenth embodiments wherein the polymer comprises at least one of derivatized polylysine, derivatized polyarginine, and derivatized polyhistidine.

A fifteenth embodiment may include any one of the first, sixth, and eleventh through fourteenth embodiments wherein the polymer comprises derivatized ε-poly-L-lysine.

A sixteenth embodiment may include any one of the sixth and eleventh through fifteenth embodiments, comprising from about 1 to about 1000 ppm of the cationic polymer.

A seventeenth embodiment may include any one of the sixth and eleventh through sixteenth embodiments wherein the cationic polymer has an acid dissociation constant ($pK_a$) in a range from about 6 to about 11.

An eighteenth embodiment may include any one of the first, sixth, and eleventh through seventeenth embodiments wherein the cationic polymer comprises a compound according to the following formula:

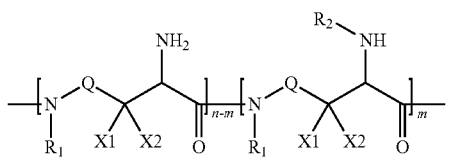

wherein Q is an optional linking group, $X_1$ and $X_2$ are substantially any group, $R_1$ is H, OH, or an alkyl group, and $R_2$ is a derivative group.

A nineteenth embodiment may include the second, seventh, or eighteenth embodiment, wherein $R_2$ comprises at least one of an alkyl carbonyl group, a divalent carboacyl group, an alkyl urea group, and an alkyl sulfonate group, an alkyl sulfone group, and an alkyl ester group.

A twentieth embodiment may include the nineteenth embodiment, wherein the alkyl carbonyl group comprises at least one of an acetyl group, a pivaloyl group, and an ethyl carbonyl group.

A twenty-first embodiment may include the nineteenth embodiment, wherein the divalent carboacyl group comprises at least one of a succinyl group, an octenyl succinyl group, a glutaric group, and a methyl succinyl group.

A twenty-second embodiment may include the nineteenth embodiment, wherein the alkyl urea group comprises at least one of an ethyl urea group, a butyl urea group, and a cyclohexyl urea group.

A twenty-third embodiment may include the nineteenth embodiment, wherein the alkyl sulfonate group comprises a methyl sulfonate group, a dimethyl sulfonate group, an ethyl sulfonate group, a propyl sulfonate group, a butyl sulfonate group, and a penta sulfonate group.

A twenty-fourth embodiment may include the nineteenth embodiment, wherein the alkyl sulfone group comprises at least one of a methyl sulfone group, and ethyl sulfone group, a propyl sulfone group, a butyl sulfone group, and a penta sulfone group.

A twenty-fifth embodiment may include the nineteenth embodiment, wherein the alkyl ester group comprises at least one of a methyl ester group, an ethyl ester group, a propyl ester group, a butyl ester group, and a penta ester group.

A twenty-sixth embodiment may include any one of the second, seventh and eighteenth through twenty-fifth embodiments, wherein: the polymer or cationic polymer comprises derivatized ε-poly-L-lysine such that Q is $C_2H_4$ and $X_1$, $X_2$, and $R_1$ are H; and $R_2$ comprises at least one of an acetyl group, a succinyl group, an ethyl urea group, a butyl urea group, and a cyclohexyl urea group, or a propyl sulfonate group.

A twenty-seventh embodiment may include any one of the second, seventh, and eighteenth through twenty-sixth embodiments, wherein n is less than 200.

A twenty-eighth embodiment may include any one of the second, seventh, and eighteenth through twenty-seventh embodiments, wherein m/n is less than ⅔.

A twenty-ninth embodiment may include any one of the eleventh through twenty-seventh embodiments, further comprising: an iron containing accelerator; and a stabilizer bound to the iron containing accelerator.

A thirtieth embodiment may include the twenty-ninth embodiment, further comprising hydrogen peroxide.

A thirty-first embodiment may include any one of the twenty-ninth through thirtieth embodiments, having a pH in a range from about 1 to about 5.

A thirtieth-second embodiment may include any one of the eleventh through twenty-eighth embodiments, further comprising a cobalt polishing accelerator.

A thirty-third embodiment may include the thirty-first embodiment having a pH in a range from about 6 to about 10.

A thirty-fourth embodiment may include any one of the eleventh through twenty-eighth embodiments, wherein the abrasive particles comprise ceria.

A thirty-fifth embodiment includes a method of chemical mechanical polishing a substrate, the method comprising: (a) contacting the substrate with a polishing composition comprising: (i) a water based liquid carrier; (ii) abrasive particles dispersed in the liquid carrier; (iii) a cationic polymer having a derivatized amino acid monomer unit; (b) moving the polishing composition relative to the substrate; and (c) abrading the substrate to remove a portion of at least one of a metal layer and a dielectric layer from the substrate and thereby polish the substrate.

A thirty-sixth embodiment may include the thirty-fifth embodiment, wherein the metal comprises at least one of tungsten and cobalt.

A thirty-seventh embodiment may include any one of the thirty-fifth through the thirty-sixth embodiments, wherein the abrasive particles comprise a colloidal silica having a permanent positive charge of at least 10 mV.

A thirty-eighth embodiment may include any one of the thirty-fifth through the thirty-seventh embodiments, wherein the metal layer comprises tungsten and the polishing composition further comprises: (i) hydrogen peroxide; (ii) an iron containing accelerator; (iii) a stabilizer bound to the soluble iron containing accelerator, the stabilizer being selected from the group consisting of phosphoric acid, phthalic acid, citric acid, adipic acid, oxalic acid, malonic acid, aspartic acid, succinic acid, glutaric acid, pimelic acid, suberic acid, azelaic acid, sebacic acid, maleic acid, glutaconic acid, muconic acid, ethylenediaminetetraacetic acid, propylenediaminetetraacetic acid, and mixtures thereof; and (iv) a pH in a range from about 1 to about 5.

A thirty-ninth embodiment may include any one of the thirty-fifth through the thirty-seventh embodiments, wherein metal layer comprises cobalt and the polishing composition further comprises: (i) a cobalt polishing accelerator; and (ii) a pH in a range from about 6 to about 10.

A fortieth embodiment may include the thirty-fifth embodiment wherein the dielectric layer comprises at least one of a silicon oxide material and a silicon nitride material and the abrasive particles comprise ceria.

A forty-first embodiment may include any one of the thirty-fifth through the fortieth embodiments, wherein the cationic polymer comprises a compound according to the following formula:

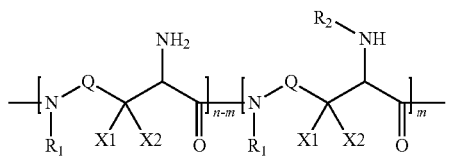

wherein Q is an optional linking group, $X_1$ and $X_2$ are substantially any group, $R_1$ is H, OH, or an alkyl group, and $R_2$ is a derivative group.

A forty-second embodiment may include the forty-first embodiment, wherein $R_2$ comprises at least one of an alkyl carbonyl group, a divalent carboacyl group, an alkyl urea group, and an alkyl sulfonate group, an alkyl sulfone group, and an alkyl ester group.

A forty-third embodiment may include one of the forty-first and forty-second embodiments, wherein the cationic polymer comprises derivatized ε-poly-L-lysine such that Q is $C_2H_4$ and $X_1$, $X_2$, and $R_1$ are H.

Example 1

Five compositions (aqueous cationic polymer solutions) were prepared as follows. One hundred grams of a 25 weight percent aqueous solution of ε-poly-L-lysine (εPLL) was combined with 175 grams of deionized water in a flask. The starting εPLL had an average number of monomer units n of about 32. Granules of succinic anhydride were added to the solution with mixing and were dissolved over several minutes. The pH of the solution was adjusted above 7 using KOH. The pH adjusted solution was stirred overnight to promote derivatization on the alpha amino acid of the ε-poly-L-lysine. The final composition included an aqueous solution having about 9 weight percent derivatized polyamino acid. Further details regarding the preparation as well as the degree of derivatization of each aqueous solution are provided in Table 1.

TABLE 1

| Composition | Amino Acid Monomer | Derivatization Compound | Derivative Group ($R_2$) | Degree of Derivatization (m/n) |
|---|---|---|---|---|
| 1A | εPLL | 3.9 grams succinic anhydride | Succinyl | 0.2 |
| 1B | εPLL | 7.8 grams succinic anhydride | Succinyl | 0.4 |
| 1C | εPLL | 11.7 grams succinic anhydride | Succinyl | 0.6 |
| 1D | εPLL | 15.6 grams succinic anhydride | Succinyl | 0.8 |
| 1E | εPLL | 19.5 grams succinic anhydride | Succinyl | 1.0 |

Compositions 1A-1E were evaluated by proton NMR NMR) to estimate the degree of derivatization. A 30-40 mg sample of the aqueous composition was dissolved in 1.0 g $D_2O$ at ambient conditions. The NMR spectra were obtained with 400 MHz NMR using solvent suppressing techniques with settings of D1=30 sec, DS=4 scans, and NS=8 scans.

An example spectrum obtained from composition 1A is depicted on the FIGURE. Note that the peaks labeled M02 are assigned to the methylene protons in the succinic acid side chain (in the derivative group) of the derivatized εPLL (the α and β protons in Formula 4 below). The backbone methylene protons (the γ, δ, ε and γ', δ', ε' protons in the following formula) are assigned to peaks M01.

Formula 4

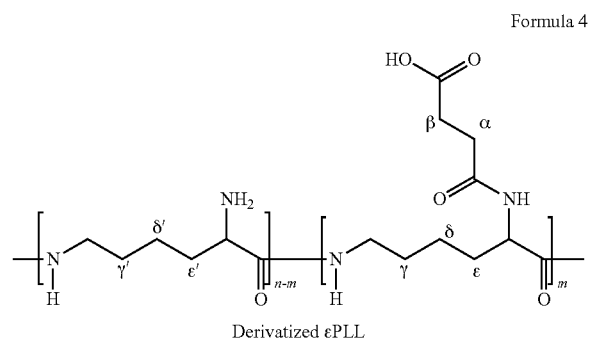

Derivatized εPLL

The degree of derivatization (succinylation in this example) was computed using the formula shown below where M01 Area and M02 Area represent the total peak area for the M01 and M02 peaks.

$$\text{Degree of Derivatization} = \frac{6 \cdot M02 \ Area}{4 \cdot M01 \ Area}$$

The degree of derivatization for composition 1A was computed to be about 19 percent based on the NMR spectrum shown on the FIGURE.

Example 2

Two acetylated compositions (aqueous cationic polymer solutions 2A and 2B) were prepared as follows. Dimethylformamide was added to an aqueous εPLL solution (from Example 1) at a 7.5 to 1 weight ratio of dimethyformamide to εPLL solution which caused the εPLL to precipitate over several hours. The precipitated εPLL was collected and dissolved in methanol. The solution was reacted at 60 degrees C. with methyl acetate for first and second periods of time. After 9 days of reaction time the degree of substitution was 34% (2A) and after 22 days of reaction time the degree of substitution was 56% (2B). The degree of substitution was determined using proton NMR as described in Example 1. These aqueous compositions are summarized in Table 2.

TABLE 2

| Composition | Amino Acid Monomer | Derivatization Compound | Derivative Group ($R_2$) | Degree of Derivatization (m/n) |
|---|---|---|---|---|
| 2A | εPLL | Methyl acetate 9 day reaction | Acetyl | 0.34 |
| 2B | εPLL | Methyl acetate 22 day reaction | Acetyl | 0.56 |

Example 3

Five compositions (aqueous cationic polymer solutions) were prepared as follows. Dimethylformamide was added to an aqueous εPLL solution (from Example 1) at a 7.5 to 1 weight ratio of dimethyformamide to εPLL solution which caused the εPLL to precipitate over several hours. The precipitated εPLL was collected (about 4 grams) and dissolved in methanol. The derivatization compound (propane sultone, ethyl isocyanate, butyl isocyanate, or cyclohexyl isocyanate in this example) was added to the methanol solution. The solution was stirred at 50 degrees C. overnight to promote derivatization (substitution of the alkyl sulfonate group (3A and 3B) or the alkyl urea groups (3C, 3D, and 3E) on the alpha amino acid of the ε-poly-L-lysine). The final solution was rota-evaporated to remove the methanol and then dissolved in water to the desired concentration. Further details regarding the preparation as well as the degree of derivatization of each aqueous solution are provided in Table 3.

TABLE 3

| Composition | Amino Acid Monomer | Derivatization Compound | Derivative Group ($R_2$) | Degree of Derivatization (m/n) |
|---|---|---|---|---|
| 3A | εPLL | 0.95 grams propane sultone | propyl sulfonate | 0.25 |
| 3B | εPLL | 1.91 grams propane sultone | propyl sulfonate | 0.5 |
| 3C | εPLL | 0.63 grams ethyl isocyanate | ethyl urea | 0.28 |
| 3D | εPLL | 0.96 grams butyl isocyanate | butyl urea | 0.31 |
| 3E | εPLL | 0.96 grams cyclohexyl isocyanate | cyclohexyl urea | 0.25 |

Compositions 3A-3E were evaluated by proton NMR to estimate the degree of derivatization using the same procedure described above in Example 1.

Example 4

The static etch rate of tungsten was evaluated for twenty-one polishing compositions (Controls A4, B4, C4, and D4 and Examples 4A, 4B, 4C, 4D, 4E, 4F, 4G, 4H, 4I, 4J, 4K, 4L, 4M, 4N, 4O, 4P, and 4Q). These compositions are listed in Table 4 along with the corresponding tungsten etch rates. Each composition included 0.17 weight percentage cationic colloidal silica, 0.04 weight percent malonic acid, 0.02 weight percent iron nitrate nonahydrate, 2.5 ppm by weight a Kathon® LX biocide, 3 weight percent hydrogen peroxide, and a tungsten etch inhibitor. The pH was adjusted to 2.75 with nitric acid or potassium hydroxide.

In control compositions A4, B4, C4, and D4 the tungsten etch inhibitor was ε-poly-L-lysine at the concentrations listed in Table 4. In inventive compositions 4A-4Q, the tungsten etch inhibitor was derivatized ε-poly-L-lysine at the concentrations listed in Table 4. Compositions 4A-4Q were prepared by adding an appropriated amount of one of the corresponding compositions 1A-1C, 2A, 2B, or 3A-3E disclosed above in Examples 1, 2, and 3. The inhibitor concentrations are listed in Table 4 in units of (i) parts per million (ppm) by weight and (ii) micro-molar cationic charge concentration. The charge concentration may be computed by multiplying the number of remaining non-derivatized monomer units (n-m in Formula 2) by the molar concentration of the derivatized polyamino acid and is a measure in moles per liter of the non-derivatized alpha amino groups in the derivatized polyamino acid. Alternatively, the cationic charge concentration may be computed (in μM) according to the following equation (where the cationic charge concentration CC in μM is recited as a function of the concentration of the derivatized polyamino acid in ppm by weight PPM:

$$CC = \frac{PPM \cdot \rho}{MW_\alpha}$$

where ρ represents the density of the composition (which is in a range from about 1.0 to about 1.1 in these example compositions), and $MW_\alpha$ represents the molecular weight of the derivatized polyamino acid compound per non-derivatized alpha amino acid which may be computed as follows:

$$MW_\alpha = \frac{dd \cdot MW_{der-mon} + (1-dd) \cdot MW_{mon}}{1-dd}$$

where dd represents the degree of derivatization (min as shown on Formula 2), $MW_{mon}$ represents the molecular weight of the non-derivatized monomer (the polylysine monomer unit in this example) and $MW_{der-mon}$ represents the molecular weight of the derivatized monomer (the derivatized polylysine monomer unit in this example).

To obtain the tungsten etch rate for each polishing composition, the composition was first heated to 60 degrees C. after which hydrogen peroxide was added to a concentration of 3 weight percent. After waiting 5 minutes for the temperature to return to 60 degrees, a Silyb tungsten wafer 1-inch square coupon having an 8000 Å thick tungsten layer was submersed in the polishing composition for 5 minutes. Tungsten removal rates were determined via resistivity measurements made before and after immersion of the wafer in the polishing compositions.

TABLE 4

| Composition | Aqueous Solution | Inhibitor | Charge Concentration (μM) | Inhibitor Concentration (ppm) | W Etch Rate (Å/min) |
|---|---|---|---|---|---|
| Control A4 | | εPLL | 0.05 | 6 | 352 |
| 4A | 1B | εPLL-suc-40 | 0.05 | 13 | 308 |
| 4B | 1C | εPLL-suc-60 | 0.05 | 21 | 294 |
| 4C | 2B | εPLL-ac-56 | 0.05 | 16 | 304 |
| Control B4 | | εPLL | 0.12 | 14 | 323 |
| 4D | 1B | εPLL-suc-40 | 0.12 | 31 | 295 |
| 4E | 1C | εPLL-suc-60 | 0.12 | 50 | 285 |
| 4F | 2B | εPLL-ac-56 | 0.12 | 37 | 288 |
| Control C4 | | εPLL | 0.15 | 20 | 356 |
| 4G | 1A | εPLL-suc-20 | 0.15 | 28 | 307 |
| 4H | 1B | εPLL-suc-40 | 0.15 | 41 | 157 |
| 4I | 1C | εPLL-suc-60 | 0.15 | 68 | 71 |
| 4J | 2A | εPLL-ac-34 | 0.15 | 29 | 210 |
| 4K | 3A | εPLL-prSO3-25 | 0.15 | 32 | 205 |
| 4L | 3B | εPLL-prSO3-50 | 0.15 | 55 | 121 |
| 4M | 3C | εPLL-etu-28 | 0.15 | 31 | 209 |
| 4N | 3D | εPLL-buu-31 | 0.15 | 34 | 74 |
| 4O | 3E | εPLL-cyhu-25 | 0.15 | 33 | 163 |
| Control D4 | | εPLL | 0.2 | 23 | 264 |
| 4P | 1B | εPLL-suc-40 | 0.2 | 49 | 82 |
| 4Q | 2B | εPLL-ac-56 | 0.2 | 59 | 77 |

As is readily apparent from the results set forth in Table 4, many of the inventive compositions including the derivatized polylysine inhibitor exhibit comparable or lower tungsten static etch rates than the control compositions having the same cationic charge concentration. For example, composition 4H has a tungsten etch rate about half that of the control C4.

Example 5

The tungsten polishing rate (removal rate) was evaluated for ten polishing compositions (Controls A5, B5, C5, D5, and E5 and Examples 5A, 5B, 5C, 5D, and 5E). Each polishing composition included cationic colloidal silica, 0.04% malonic acid, 0.02% iron nitrate nonahydrate, 2.5 ppm by weight Kathon® LX biocide, 3 weight percent hydrogen peroxide, and a tungsten etch inhibitor. The pH was adjusted to 2.75 with nitric acid or potassium hydroxide. The cationic colloidal silica particles were prepared as described in Example 7 of U.S. Pat. No. 9,382,450. The silica concentrations are listed in Table 5. The tungsten etch inhibitor was prepared as described above for composition 1B in Example 1. The inhibitor concentrations are also listed in Table 5 in units of (i) parts per million (ppm) by weight and (ii) micro-molar cationic charge concentration as described above in Example 4.

Tungsten blanket wafers (Silyb 2 k W blankets, 200 mm) were polished to endpoint+10% using an Applied Materials Mirra polishing tool, a NexPlanar E6088 polishing pad (available from Cabot Microelectronics), a 3M A122 conditioner (ex situ mode at 8 pounds) using a down force of 3.5 psi, a platen speed of 80 rpm, a head speed of 89 rpm, and a slurry flow rate of 90 mL/min. The tungsten RR was determined by flag time, the point in time where W metal starts to clear (the removal rate being 2000 Å divided by the flag time in minutes).

TABLE 5

| Composition | Inhibitor | Charge Concentration (μM) | Inhibitor Concentration (ppm) | Cationic Silica (w/o) | W Removal Rate (Å/min) |
|---|---|---|---|---|---|
| Control A5 | εPLL | 0.1 | 13 | 0.5 | 1670 |
| 5A | εPLL-suc-40 | 0.04 | 13 | 0.5 | 1793 |
| Control B5 | εPLL | 0.26 | 33 | 0.33 | 238 |
| 5B | εPLL-suc-40 | 0.1 | 33 | 0.33 | 1294 |
| Control C5 | εPLL | 0.41 | 53 | 0.17 | 202 |
| 5C | εPLL-suc-40 | 0.17 | 53 | 0.17 | 449 |
| Control D5 | εPLL | 0.41 | 53 | 0.5 | 256 |
| 5D | εPLL-suc-40 | 0.17 | 53 | 0.5 | 448 |
| Control E5 | εPLL | 0.1 | 13 | 0.17 | 1140 |
| 5E | εPLL-suc-40 | 0.04 | 13 | 0.17 | 1749 |

As is readily apparent from the results set forth in Table 5, the inventive compositions including the derivatized polyamino acid inhibitor achieved higher removal rates than the control compositions at equal inhibitor concentrations by weight.

Example 6

Erosion and dishing of tungsten patterned wafers were evaluated for two polishing compositions (Control A6 and Example 6A). The control composition (A6) was identical to control E5 in Example 5. The inventive composition (6A) was identical to composition 5B in Example 5.

Tungsten pattern wafers (Silyb 2 k W 854 line & space pattern, 200 mm) were polished to endpoint+30% using an Applied Materials Mirra polishing tool and a NexPlanar E6088 polishing pad (available from Cabot Microelectronics). The pad was conditioned using 3M A122 conditioner (ex situ mode at 8 pounds for 24 seconds). The wafers were polished using a down force of 3.5 psi, a platen speed of 80 rpm, a head speed of 89 rpm, and a slurry flow rate of 90 ml/min. The tungsten polishing rate was determined by flag time, the point in time where W metal starts to clear (the removal rate being 2000 Å divided by the flag time in minutes). Removal rate data is presented in Table 6A. Erosion and dishing results are presented in Table 6B. The erosion and dishing measurements values were obtained using atomic force microscope (AFM) profilometer measurements across the corresponding feature. Average and Within Die Nonuniformity (WIDNU) erosion and dishing values are also presented in Table 6B with WIDNU being defined in this example as the range of dishing or erosion values (the maximum value minus minimum value). The pattern wafer features were lines (the line widths and spaces are reported).

TABLE 6A

| Composition | Inhibitor | W Removal Rate (Å/min) | TEOS Removal Rate (Å/min) |
|---|---|---|---|
| Control A6 | εPLL | 3484 | 21 |
| 6A | εPLL-suc-40 | 3099 | 16 |

TABLE 6B

| | Control Composition A6 | | Inventive Composition 6A | |
|---|---|---|---|---|
| Patterned Wafer Feature | Erosion (Å) | Dishing (Å) | Erosion (Å) | Dishing (Å) |
| 1 μm × 3 μm | 16 | 239 | 52 | 50 |
| 3 μm × 1 μm | 230 | 138 | 62 | 60 |
| 50 μm × 50 μm | 39 | 404 | 32 | 57 |
| 0.18 μm × 0.18 μm | 137 | 62 | 40 | 46 |
| 5 μm × 1 μm | 368 | 169 | 107 | 77 |
| MEAN | 158 | 202 | 59 | 58 |
| WIDNU | 352 | 342 | 75 | 31 |

As is readily apparent from the results set forth in Tables 6A and 6B, composition 6A provides superior erosion and dishing performance as compared to the control composition. Notably, composition 6A provides significantly improved average (mean) erosion and dishing and significantly improved erosion and dishing WIDNU over a wide range of pattern features. Those of ordinary skill will readily appreciate that achieving low erosion and dishing WIDNU over a wide range of pattern features is a daunting challenge facing the CMP operator especially for advanced node CMP applications. The improvements shown in Table 6B represent a significant advantage.

Example 7

The static etch rate of cobalt was evaluated for twelve polishing compositions (Control A7 and Examples 7A, 7B, 7C, 7D, 7E, 7F, 7G, 7H, 7I, 7J, and 7K). These compositions are listed in Table 7 along with the corresponding cobalt etch rates. Each composition included 0.5 weight percent colloidal silica, 0.75 weight percent glycine, and 100 ppm by weight cobalt inhibitor. The pH was adjusted to 8.5 with KOH.

In control composition A7 the cobalt etch inhibitor was ε-poly-L-lysine. In inventive compositions 7A-7K, the cobalt etch inhibitor was derivatized ε-poly-L-lysine. Compositions 7A-7K were prepared by adding an appropriated amount of one of the corresponding compositions 1A-1E, 2B, or 3A-3E disclosed above in Examples 1, 2, and 3.

To obtain the cobalt etch rate for each polishing composition, the composition was heated to 35 degrees C. Two 1-inch square Silyb Co 2 k coupons were submerged in each composition for 3 minutes. Cobalt etch rates were determined via resistivity measurements made before and after immersion. Average values are reported in Table 7.

TABLE 7

| Composition | Aqueous Solution | Inhibitor | Inhibitor Concentration (ppm) | Co Etch Rate (Å/min) |
|---|---|---|---|---|
| Control A7 | | εPLL | 100 | 47 |
| 7A | 1A | εPLL-suc-20 | 100 | 43 |
| 7B | 1B | εPLL-suc-40 | 100 | 16 |
| 7C | 1C | εPLL-suc-60 | 100 | 12 |
| 7D | 1D | εPLL-suc-80 | 100 | 10 |
| 7E | 1E | εPLL-suc-100 | 100 | 11 |
| 7F | 2B | εPLL-ac-56 | 100 | 13 |
| 7G | 3A | εPLL-prSO$_3$-25 | 100 | 13 |
| 7H | 3B | εPLL-prSO$_3$-50 | 100 | 12 |
| 7I | 3C | εPLL-etu-28 | 100 | 16 |
| 7J | 3D | εPLL-buu-31 | 100 | 18 |
| 7K | 3E | εPLL-cyhu-25 | 100 | 7 |

As is readily apparent from the results set forth in Table 7, the inventive compositions provide a significantly reduced cobalt etch rate as compared to the control composition.

Example 8

The static etch rate of cobalt was evaluated for fifteen polishing compositions (Controls A8, B8, C8, and D8 and Examples 8A, 8B, 8C, 8D, 8E, 8F, 8G, 8H, 8I, 8J, and 8K). These compositions are listed in Table 8 along with the corresponding cobalt etch rates. Each composition included 0.5 weight percent colloidal silica, 0.75 weight percent glycine, and cobalt inhibitor. The pH was adjusted to 8.5 with potassium hydroxide. The type and amount of cobalt inhibitor is listed in Table 8.

In control compositions A8, B8, C8, and D8, the cobalt etch inhibitor was ε-poly-L-lysine. In inventive compositions 8A-8K, the cobalt etch inhibitor was derivatized ε-poly-L-lysine. Compositions 8A-8K were prepared by adding an appropriated amount of one of the corresponding compositions 1A-1C, 2B, or 3B-3E disclosed above in Examples 1, 2 and 3.

To obtain the cobalt etch rate for each polishing composition, the composition was heated to 35 degrees C. Two 1-inch square Silyb Co 2 k coupons were submerged in each composition for 5 minutes. The time was increased from three minutes to five minutes to increase the signal as cobalt etch rates are known to sometimes increase significantly with time (as cobalt etching can be autocatalytic). Cobalt etch rates were determined via resistivity measurements made before and after immersion. Average values are reported in Table 8.

TABLE 8

| Composition | Aqueous Solution | Inhibitor | Inhibitor Concentration (ppm) | Co Etch Rate (Å/min) |
|---|---|---|---|---|
| Control A8 | | εPLL | 50 | >400 |
| Control B8 | | εPLL | 100 | >400 |
| Control C8 | | εPLL | 200 | >400 |
| Control D8 | | εPLL | 300 | >400 |
| 8A | 1C | εPLL-suc-60 | 50 | 7 |
| 8B | 1C | εPLL-suc-60 | 100 | 6 |
| 8C | 1C | εPLL-suc-60 | 200 | 5 |
| 8D | 1C | εPLL-suc-60 | 300 | 8 |
| 8E | 1A | εPLL-suc-20 | 50 | 14 |
| 8F | 1B | εPLL-suc-40 | 50 | 12 |
| 8G | 2B | εPLL-ac-56 | 100 | 155 |
| 8H | 3B | εPLL-prSO$_3$-50 | 50 | 12 |
| 8I | 3C | εPLL-etu-28 | 100 | 25 |
| 8J | 3D | εPLL-buu-31 | 100 | 61 |
| 8K | 3E | εPLL-cyhu-25 | 100 | 9 |

As is readily apparent from the results set forth in Table 8, the inventive compositions provide significantly reduced cobalt etch rates as compared to the control composition. The improvement is more pronounced with the longer etch time in this example.

Example 9

The cobalt polishing rate (removal rate) was evaluated for fourteen polishing compositions (Control A9 and Examples 9A, 9B, 9C, 9D, 9E, 9F, 9G, 9H, 9I, 9J, 9K, 9L, and 9M). Each polishing composition included 0.5 weight percent colloidal silica (Fuso PL-2), 0.75 weight percent glycine, and a cobalt etch inhibitor. The pH was adjusted to 8.5 with potassium hydroxide. The type and amount of cobalt inhibitor is listed in Table 9.

In control composition A9, the cobalt etch inhibitor was ε-poly-L-lysine. In inventive compositions 9A-9M, the cobalt etch inhibitor was derivatized ε-poly-L-lysine. Compositions 9A-9M were prepared by adding an appropriated amount of one of the corresponding compositions 1A-1E, 2B, or 3A-3E disclosed above in Examples 1, 2, and 3.

The cobalt removal rate was measured for a Silyb Co 2 k coupon using a Rheometer (ARG-2) with a Fujibo donut pad having an outside radius of 32 mm and an inside radius 16 mm. The polishing temperature was 25 degree C. The downforce as 4N (1.2 psi). The pad rotation rate was 130 rpm. Three ml of slurry was utilized. The polishing time was 15 seconds. Cobalt removal rates for each composition are listed in Table 9.

TABLE 9

| Composition | Aqueous Solution | Inhibitor | Inhibitor Concentration (ppm) | Co Removal Rate (Å/min) |
|---|---|---|---|---|
| Control A9 | | εPLL | 100 | 2612 |
| 9A | 1A | εPLL-suc-20 | 100 | 2783 |
| 9B | 1B | εPLL-suc-40 | 50 | 2053 |
| 9C | 1C | εPLL-suc-60 | 50 | 101 |
| 9D | 1C | εPLL-suc-60 | 100 | 84 |
| 9E | 1D | εPLL-suc-80 | 100 | 60 |
| 9F | 1E | εPLL-suc-100 | 100 | 73 |
| 9G | 2B | εPLL-ac-56 | 100 | 2734 |
| 9H | 3A | εPLL-prSO$_3$-25 | 100 | 2469 |
| 9I | 3B | εPLL-prSO$_3$-50 | 50 | 1413 |
| 9J | 3B | εPLL-prSO$_3$-50 | 100 | 179 |
| 9K | 3C | εPLL-etu-28 | 100 | 2184 |
| 9L | 3D | εPLL-buu-31 | 100 | 2160 |
| 9M | 3E | εPLL-cyhu-25 | 100 | 2003 |

As is readily apparent from the results set forth in Table 9, many of the inventive compositions provide a comparable cobalt removal rate to that achieved using the control composition. This represents a significant improvement given the reduced cobalt etch rates disclosed above in Examples 7 and 8.

Example 10

Dielectric polishing rates were evaluated for four polishing compositions (controls A10 and B10 and inventive compositions 10A and 10B). Each composition included 150 ppm by weight polyvinylpyrrolidone (5000 g/mol), 675 ppm by weight acetic acid, 0.1 weight percent crotonic acid, 100 ppm picolinic acid, 75 ppm by weight Kordex MLX biocide, 0.2 weight percent ceria, and εPLL or derivatized εPLL at pH 4. The ceria was identical to that described in Example 1 of commonly assigned U.S. Provisional Patent Application Ser. No. 62/924,328. Control compositions A10 and B10 included 10 and 30 ppm by weight εPLL. Inventive compositions 10A and 10B included 10 and 30 ppm by weight of acetylated εPLL (from aqueous composition 2B described above in Example 2).

Blanket tetraethylorthosilicate (TEOS), high density plasma (HDP) oxide, and SiN-PE wafers were polished for 60 seconds each on a Mirra® tool at a platen speed of 100 rpm, a head speed of 85 rpm, a downforce of 3 psi, and a slurry flow rate of 150 ml/min. The wafers were polished on a NexPlanar® E6088 pad (available from Cabot Microelectronics Corporation) with in-situ conditioning using a Saesol DS8051 conditioner at 6 pounds downforce. The TEOS wafers were obtained from WRS Materials and included a 20 kA TEOS layer. The HDP wafers were obtained from Silyb and included a 10 kA HDP oxide layer. The SiN-PE wafers were obtained from Advantec and included a 5 kA PE SiN layer. Polishing data are shown in Table 10. All removal rates are listed in angstroms per minute (Å/min).

TABLE 10

| Composition | Cationic Polymer | TEOS RR | HDP RR | SiN-PE RR |
|---|---|---|---|---|
| Control A10 | 10 ppm εPLL | 7385 | 6315 | 20 |
| Control B10 | 30 ppm εPLL | 1103 | 1196 | 17 |
| 10A | 10 ppm εPLL-ac-56 | 7212 | 6520 | 20 |
| 10B | 30 ppm εPLL-ac-56 | 6914 | 6113 | 21 |

As is readily apparent from the results set forth in Table 10, composition 10B achieves superior TEOS and HDP removal rates at higher polymer loadings as compared to the control composition B10.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A chemical mechanical polishing composition comprising:
   a water based liquid carrier;
   abrasive particles dispersed in the liquid carrier; and
   a cationic polymer comprising a compound according to the following formula:

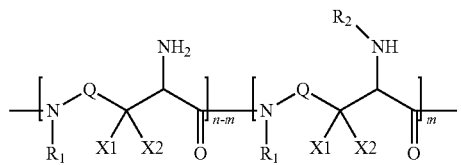

wherein Q is an optional linking group, $X_1$ and $X_2$ are substantially any group, $R_1$ is H, OH, or an alkyl group, and $R_2$ is a derivative group, wherein $R_2$ comprises at least one of an alkyl carbonyl group, a divalent carboacyl group, an alkyl urea group, and an alkyl sulfonate group, an alkyl sulfone group, and an alkyl ester group.

2. The composition of claim 1, wherein the abrasive particles comprise a colloidal silica abrasive having a positive charge of at least 10 mV.

3. The composition of claim 1, wherein the derivatized amino acid monomer unit comprises a derivative group bonded to an alpha amino group in the monomer unit.

4. The composition of claim 1, wherein the cationic polymer comprises at least one of derivatized polylysine, derivatized polyarginine, and derivatized polyhistidine.

5. The composition of claim 4, wherein the cationic polymer comprises derivatized ε-poly-L-lysine.

6. The composition of claim 1, comprising from about 1 to about 1000 ppm of the cationic polymer.

7. The composition of claim 1, wherein the cationic polymer has an acid dissociation constant ($pK_a$) in a range from about 6 to about 11.

8. The composition of claim 1, wherein the alkyl carbonyl group comprises at least one of an acetyl group, a pivaloyl group, and an ethyl carbonyl group.

9. The composition of claim 1, wherein the divalent carboacyl group comprises at least one of a succinyl group, an octenyl succinyl group, a glutaric group, and a methyl succinyl group.

10. The composition of claim 1, wherein the alkyl urea group comprises at least one of an ethyl urea group, a butyl urea group, and a cyclohexyl urea group.

11. The composition of claim 1, wherein the alkyl sulfonate group comprises a methyl sulfonate group, a dimethyl sulfonate group, an ethyl sulfonate group, a propyl sulfonate group, a butyl sulfonate group, and a penta sulfonate group.

12. The composition of claim 1, wherein the alkyl sulfone group comprises at least one of a methyl sulfone group, and ethyl sulfone group, a propyl sulfone group, a butyl sulfone group, and a penta sulfone group.

13. The composition of claim 1, wherein the alkyl ester group comprises at least one of a methyl ester group, an ethyl ester group, a propyl ester group, a butyl ester group, and a penta ester group.

14. The composition of claim 1, wherein:
   the cationic polymer comprises derivatized ε-poly-L-lysine such that Q is $C_2H_4$ and $X_1$, $X_2$, and $R_1$ are H; and
   R2 comprises at least one of an acetyl group, a succinyl group, an ethyl urea group, a butyl urea group, and a cyclohexyl urea group, or a propyl sulfonate group.

15. The composition of claim 1, wherein n is less than 200.

16. The composition of claim 1 wherein m:n is less than ⅔.

17. The composition of claim 1, further comprising:
   an iron containing accelerator; and a stabilizer.

18. The composition of claim 17, further comprising hydrogen peroxide.

19. The composition of claim 17, having a pH in a range from about 1 to about 5.

20. The composition of claim 1, further comprising a cobalt polishing accelerator.

21. The composition of claim 20, having a pH in a range from about 6 to about 10.

22. The composition of claim 1, wherein the abrasive particles comprise ceria.

23. A method of chemical mechanical polishing a substrate, the method comprising:
   (a) contacting the substrate with a polishing composition comprising:
      (i) a water based liquid carrier;
      (ii) abrasive particles dispersed in the liquid carrier;
      (iii) a cationic polymer comprising a compound according to the following formula:

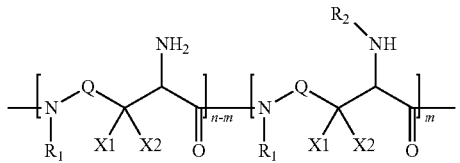

wherein Q is an optional linking group, $X_1$ and $X_2$ are substantially any group, $R_1$ is H, OH, or an alkyl group, and $R_2$ is a derivative group, wherein $R_2$ comprises at least one of an alkyl carbonyl group, a divalent carboacyl group, an alkyl urea group, and an alkyl sulfonate group;

(b) moving the polishing composition relative to the substrate; and (c) abrading the substrate to remove a portion of at least one of a metal layer and a dielectric layer from the substrate and thereby polish the substrate.

24. The method of claim 23, wherein the metal layer comprises at least one of tungsten and cobalt.

25. The method of claim 23, wherein the abrasive particles comprise a colloidal silica having a permanent positive charge of at least 10 mV.

26. The method of claim 23, wherein the metal layer comprises tungsten and the polishing composition further comprises:
(i) hydrogen peroxide;
(ii) an iron containing accelerator;
(iii) a stabilizer, the stabilizer being selected from the group consisting of phosphoric acid, phthalic acid, citric acid, adipic acid, oxalic acid, malonic acid, aspartic acid, succinic acid, glutaric acid, pimelic acid, suberic acid, azelaic acid, sebacic acid, maleic acid, glutaconic acid, muconic acid, ethylenediaminetetraacetic acid, propylenediaminetetraacetic acid, and mixtures thereof; and
(iv) a pH in a range from about 1 to about 5.

27. The method of claim 23, wherein the metal layer comprises cobalt and the polishing composition further comprises:
(i) a cobalt polishing accelerator; and
(ii) a pH in a range from about 6 to about 10.

28. The method of claim 23, wherein the dielectric layer comprises at least one of a silicon oxide material and a silicon nitride material and the abrasive particles comprise cerin.

29. The method of claim 23, wherein the cationic polymer comprises derivatized ε-poly-L-lysine such that Q is $C_2H_4$ and $X_1$, $X_2$, and $R_1$ are H.

* * * * *